United States Patent
Henzler et al.

(10) Patent No.: US 7,427,882 B2
(45) Date of Patent: Sep. 23, 2008

(54) METHOD AND APPARATUS FOR SWITCHING ON A VOLTAGE SUPPLY OF A SEMICONDUCTOR CIRCUIT AND CORRESPONDING SEMICONDUCTOR CIRCUIT

(75) Inventors: Stephan Henzler, München (DE); Jörg Berthold, München (DE); Christian Pacha, München (DE); Doris Schmitt-Landsiedel, Ottobrunn (DE); Thomas Nirschl, Essex Junction, VT (US); Georg Georgakos, Fraunberg (DE)

(73) Assignee: Infineon Technologies AG, Munich (DE)

( * ) Notice: Subject to any disclaimer, the term of this patent is extended or adjusted under 35 U.S.C. 154(b) by 42 days.

(21) Appl. No.: 11/498,505

(22) Filed: Aug. 3, 2006

(65) Prior Publication Data

US 2007/0085573 A1   Apr. 19, 2007

(30) Foreign Application Priority Data

Aug. 12, 2005   (DE) ........................ 10 2005 038 231

(51) Int. Cl.
*H03L 7/00* (2006.01)
(52) U.S. Cl. ...................................... 327/143; 327/532
(58) Field of Classification Search ......... 327/530–532, 327/536, 537, 589, 143, 100, 108
See application file for complete search history.

(56) References Cited

U.S. PATENT DOCUMENTS

| | | | | |
|---|---|---|---|---|
| 5,397,928 A | * | 3/1995 | Chan et al. | ................... 307/109 |
| 6,184,663 B1 | | 2/2001 | Imai et al. | |
| 6,661,682 B2 | * | 12/2003 | Kim et al. | ...................... 363/59 |
| 7,009,857 B2 | * | 3/2006 | Chen et al. | ..................... 363/60 |

FOREIGN PATENT DOCUMENTS

| | | |
|---|---|---|
| DE | 199 40 579 A1 | 3/2000 |
| WO | WO 02/052688 A1 | 7/2002 |

OTHER PUBLICATIONS

Suhwan Kim et al., Understanding and Minimizing Ground Bounce During Mode Transition of Power Gating Structures, ISLPED'03, Aug. 25-27, 2003, Seoul, Korea.

* cited by examiner

*Primary Examiner*—Dinh T. Le
(74) *Attorney, Agent, or Firm*—Brinks Hofer Gilson & Lione

(57) ABSTRACT

A method and an apparatus for switching on a voltage supply of a voltage domain of a semiconductor circuit is disclosed. A voltage supply is connected to a supply voltage of the semiconductor circuit by means of a switchable element. The switchable element is activated in such a way that, for switching on the voltage supply of the voltage domain, a current through the switchable element rises progressively with at least one intermediate value, in particular stepwise manner.

22 Claims, 6 Drawing Sheets

METHOD AND APPARATUS FOR SWITCHING ON A VOLTAGE SUPPLY OF A SEMICONDUCTOR CIRCUIT AND CORRESPONDING SEMICONDUCTOR CIRCUIT

RELATED APPLICATIONS

The present application claims priority to German Application No DE 10 2005 038 231.2, filed Aug. 12, 2005, the entirety of which is hereby incorporated herein by reference.

BACKGROUND OF THE DISCLOSURE

The present disclosure relates to a method and an apparatus for switching on a voltage supply of a semiconductor circuit and to a correspondingly configured semiconductor circuit.

The switching off of unrequired circuit blocks of a semiconductor circuit is a proven method of reducing leakage current losses in intermittently unrequired circuit portions. Once they have been switched off, the inner capacitors of the switched off circuit blocks discharge. These capacitors have to be recharged once they have been switched on again. Uncontrolled switching operations (glitches) can occur during the reconnection process and cause additional current on supply lines of the semiconductor circuit in addition to the load current for the capacitors. Consequently, a high current peak has to be allowed for shortly after a circuit block has been switched on again. This causes a high IR drop (a drop in the supply voltage due to resistive influences), which temporarily reduces the supply voltage of circuit portions adjoining the voltage blocks which have just been switched on and can thus lead to violation of the timing behavior and to disturbances in operation in these circuit portions, also known as soft error. For this reason, it is of crucial importance to monitor and minimize the current peak when switching on circuit blocks which are intermittently switched off.

In addition to the circuit peaks caused by the resistive drop in voltage, the rise rate, at which the load current rises, also leads to problems when the voltage supply is switched on. This effect is due to the action of parasitic inductances, which, in accordance with:

$$U = L * \frac{dI}{dt}$$

also lead to a voltage drop in the supply voltage which is proportional to the rise rate.

SUMMARY OF THE DISCLOSURE

Advantageously, the present disclosure provides a method and an apparatus for switching on a voltage supply of a semiconductor circuit and a correspondingly configured semiconductor circuit wherein current peaks and an excessive rise rate when switching on circuit blocks of the semiconductor circuit which are intermittently switched off are monitored and minimized.

The present disclosure provides a method for switching on a voltage supply of a voltage domain of a semiconductor circuit. The voltage supply is connected to a supply voltage, in particular $V_{SS}$ and $V_{DD}$ of the semiconductor circuit, by means of a switchable element. The switchable element is activated to switch on the voltage supply of the voltage domain in such a way that a current through the switchable element rises progressively, in particular stepwise, with at least one intermediate value. It is pointed out that a method with which two power supplies, in particular, for example, $V_{SS}$ and $V_{DD}$, can also be switched by a respective switchable element also falls within the scope of the present disclosure. In the scope of the present disclosure, a gradual rise is understood to be a rise which is slower than by conventional circuits, i.e. a rise with which a first derivative of a current characteristic has lower values relative to time than is conventional when switching on the voltage supply current circuits.

As the current only rises progressively owing to the switchable element, current peaks and an excessive current rise rate when the voltage supply of the voltage domain is switched on, which is conventional in current circuits, are advantageously avoided. In addition, a peak current value is advantageously also limited by the switchable element, i.e. the peak value lies under a comparable peak value known in current circuits.

Advantageously, for switching on the voltage supply of the voltage domain, a voltage between the control input of the transistor and a first terminal of the transistor is progressively increased with at least one intermediate value. In other words, the voltage between the control input and the first terminal, when the voltage supply of the voltage domain is switched on, possesses a time characteristic comprising an initial value, at least one intermediate value and a final value. In accordance with the disclosure, therefore, the time characteristic of the voltage comprises both a continuous and a stepped characteristic.

Owing to the activation of the control input of the transistor according to the disclosure, in other words, owing to the gradual increase in the voltage between the control input and the first terminal of the transistor with at least one intermediate value, the voltage supply of the voltage domain is switched on without a current peak or an excessively high current rise rate accounting. The switching on of the voltage supply of the voltage domain according to the disclosure differs on account of the gradual increase in the voltage between the control input and the first terminal of the transistor from the conventional switching on in current circuits, with which it is conventional to apply the voltage between the control input and the first terminal of the transistor in one go—in other words, without an intermediate value.

With the stepwise increase in the voltage between the control input and the first terminal of the transistor, a number of steps which is greater than 2 can be selected. With a preferred embodiment according to the disclosure, very many (for example more than 10) very small steps are used so that a quasilinear voltage characteristic between the control input and the first terminal of the transistor is obtained.

The more steps the stepwise increase in the voltage between the control input and the first terminal of the transistor comprises, the better the transistor can monitor the current and the better the peak value of the current can be limited.

With the stepwise increase in the voltage between the control input and the first terminal of the transistor, a step height can be equal, i.e. all steps of a stair-like time characteristic of the voltage between the control input and the first terminal of the transistor have the same height.

The advantage of the stair-like time characteristic of the voltage between the control input and the first terminal of the transistor, with which the height of the individual steps is equal, is that this characteristic can be achieved in a technically simple manner as, for example, only one capacitor with an invariable capacitance value, with which the voltage between the control input and the first terminal of the transistor is built up, is required for this purpose.

Advantageously, a step height with the stair-like time characteristic of the voltage between the control input and the first terminal of the transistor is greater until attainment of the Miller plateau than after attainment of the Miller plateau.

A voltage value of the voltage between the control input and the first terminal of the transistor on attainment of the Miller plateau should be equated to the threshold voltage or $V_{th}$ of the transistor, i.e. from attainment of the Miller plateau, the current begins to flow significantly through the transistor. Prior to attainment of the threshold voltage, what is known as a below-threshold current, which is much lower than the current after attainment of the threshold for voltage, flows. For this reason, the steps until attainment of the Miller plateau can be selected to be greater than the steps of the time characteristic of the voltage between the control input and the first terminal of the transistor after attainment of the threshold voltage or after attainment of the Miller plateau, as only a low below-threshold current through the transistor and therefore no current peaks are thus generated.

In accordance with the disclosure, the time characteristic of the voltage between the control input and the first terminal of the transistor can also be adjusted with only one step until attainment of the Miller plateau. In other words, when the voltage supply of the voltage domain is switched on, the voltage between the control input and the first terminal of the transistor is immediately adjusted to the threshold voltage of the transistor or the voltage jumps to the threshold voltage.

Since, as already described hereinbefore, only a low current flows through the transistor until the Miller plateau is reached, it is advantageous to optimize the voltage characteristic between the control input and the first terminal of the transistor in such a way that the threshold voltage of the transistor is attained as quickly as possible.

In accordance with the disclosure, rapid attainment of the threshold voltage can also be achieved in that a time interval which elapses until a step height, with which the voltage between the control input and the first terminal of the transistor is increased stepwise, is shorter until attainment of the Miller plateau than after attainment of the Miller plateau. In other words, the steps in the time characteristic of the voltage between the control input and the first terminal of the transistor are increased faster and more frequently in time up to the threshold voltage than after attainment of the Miller plateau.

Once the Miller plateau has been passed through, i.e. once all internal capacitors have been charged, a greater step height can also be selected again than when passing through the Miller plateau.

In accordance with the disclosure, the switching on of the voltage supply of the voltage domain can also be optimized in that a time characteristic of the voltage between the control input and the first terminal of the transistor can be adjusted in such a way that a minimum time interval which elapses until the voltage supply of the voltage domain is switched on in such a way that any elements arranged inside the voltage domain operate correctly, subject to the constraint that the peak current value through the transistor must not be exceeded.

Advantageously, the voltage between the control input and the first terminal of the transistor is increased by means of switched capacitor technology using a capacitor network of adjustable capacitance.

It is therefore possible to adjust the step height of the steps of the time characteristic of the voltage between the control input and the first terminal of the transistor in that the capacitance value of the capacitor network, by means of which the voltage between the control input and the first terminal to the transistor is increased step by step, is adjusted accordingly.

If the semiconductor circuit comprises a plurality of voltage domains of which the respective voltage supply can be switched off and which are connected with one or more respective transistors to the supply voltage of the semiconductor circuit, the voltage between the control input and the first terminal in each transistor can be increased stepwise by means of switched capacitor technology using a capacitor network of adjustable capacitance.

It is therefore possible to switch on the voltage supply of a plurality of voltage domains simultaneously or in parallel, using a capacitor network, no current peak and no excessively high current rise rate occurring in accordance with the disclosure owing to the stepwise increase in the voltage between the control input and the first terminal of each transistor.

Advantageously, for all transistors with which the voltage supplies of the plurality of voltage domains can be switched, the threshold voltage is determined and a minimum value amount for these threshold voltages or a minimum amount threshold voltage is determined. A first step with which the voltage between the control input and the first terminal in all transistors, with which the voltage supplies of the plurality of voltage domains can be switched, is then advantageously adjusted in such a way that its value corresponds to the minimum threshold voltage.

This ensures that the range of the voltage characteristic between the control input and the first terminal of the transistor, at which no current yet follows through the transistors, is overcome almost optimally quickly.

The present disclosure also provides an apparatus for switching on a power supply of a voltage domain of a semiconductor circuit. The apparatus comprises a switchable element, in particular a transistor, and control means. The voltage supply of the voltage domain is switchably connected to the supply voltage of the semiconductor circuit by the switchable element. The control means serve to activate the switchable element so that a current rises progressively, in particular stepwise, with at least one intermediate value, owing to the switchable element. The control means are advantageously configured in such a way that, for switching on the voltage supply of the voltage domain, the voltage between the control input and the first terminal of the transistor is increased progressively with at least one intermediate value, in particular stepwise. The stepwise increase in the voltage between the control input and the first terminal of the transistor can be brought about by a capacitor, in particular by a capacitor network of adjustable capacitance.

The advantages of the apparatus according to the disclosure and the embodiments thereof have already been set out in the description of the method according to the disclosure, so they will not be repeated here.

The present disclosure also provides a semiconductor circuit with a voltage supply which can be switched on and off, comprising an apparatus according to the disclosure for switching on the at least one voltage supply.

To sum up, a basic idea of the disclosure is not to completely switch on individual switchable elements (in particular what are known as power switch transistors) or specific switchable elements in succession but, for example, in particular to slowly increase the gate-source voltage of one or more power switch transistors, i.e. the gate overdrive. The rise rate of the loading current and the maximum loading current are thus advantageously reduced in comparison with switching processes for power switch transistors in current circuits.

As the exact value of the threshold voltage of a given power switch transistor depends greatly on the production process for the corresponding semiconductor circuit, determination thereof involves complex methods. The method according to the disclosure does not necessitate exact knowledge of the value of the threshold voltage of a predetermined power switch transistor, which is used to switch on a voltage supply, as it almost approaches the threshold voltage of the power switch transistor owing to the gate-source voltage which rises stepwise. In this way, the gate overdrive is accelerated slowly, in particular in the manner of a ramp.

The disclosure comprises, in particular, a method and an apparatus with which the gate-source voltage is generated not in an analog manner but digitally, for example by means of switched capacitor, charge pump or switched current technology. The advantage of the digital variation according to the disclosure is that a complex analog circuit with voltage references and operational amplifiers is not required, so the digital variation is more robust than the analog variation of the disclosure, for example relative to process variations during the production of the semiconductor circuit. In addition, the digital variation consumes far less chip area, and this is economically advantageous. The digital variation does not necessitate the high-loss generation and calibration of low voltages either. Switched capacitor circuitry also allows simple adaptation of the load current rise rate by means of a variation in the clock rate, the pulse duty rate or by means of corresponding adjustments of the capacitors used, which capacitors are used to load the gate source voltage by means of clocked switches. In accordance with the disclosure, therefore, it is possible to switch on the voltage supply very quickly or, if many voltage domains have to be switched on simultaneously, to switch on the voltage supplies of these voltage domains only very slowly in order to keep a total low current low. In addition, owing to the ease of adjustment, a calibration process is also feasible during the testing of the semiconductor circuit or during what is known as the burn-in. For example, a more effective (minimum-value) threshold voltage of a parallel circuit of all microswitches can be determined and the apparatus can thus be programmed accordingly with the capacitor network.

The present disclosure is capable, in particular, of switching on these voltage supplies in the case of a semiconductor circuit comprising voltage domains of which the voltage supplies can be switched off. However, the disclosure is obviously not restricted to this preferred field of application, but can be used generally to bring a circuit portion to a predetermined voltage potential without in so doing exceeding a predetermined load current peak value and without in so doing exceeding a predetermined maximum load current rise rate.

DETAILED DESCRIPTION OF THE DISCLOSURE

Figure 1:
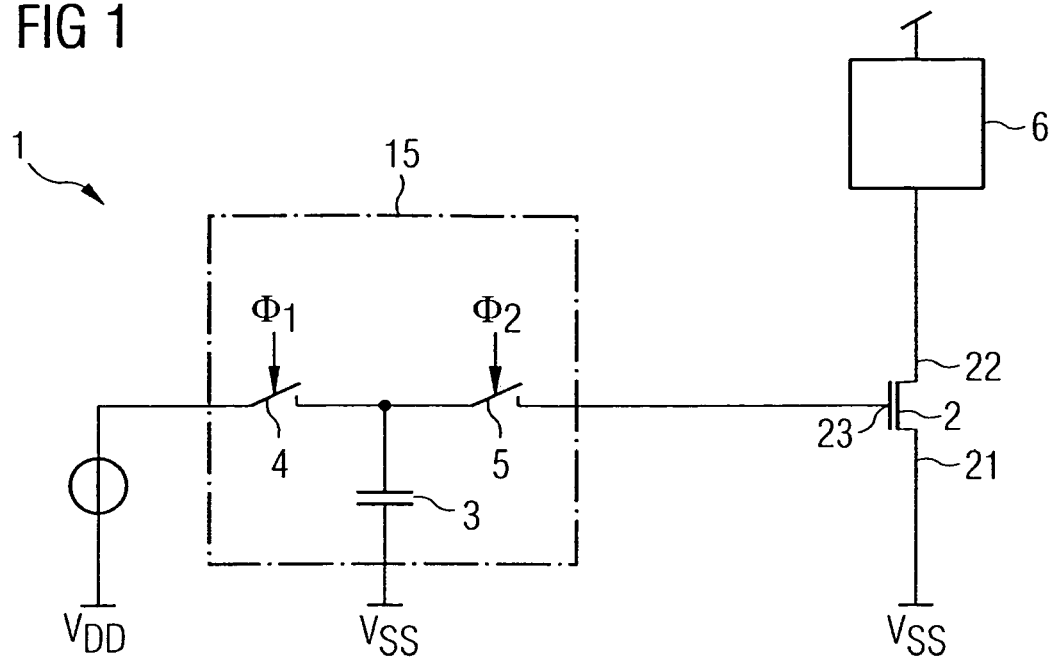
FIG. 1 shows one embodiment of an apparatus for switching on a voltage supply of a voltage domain.
Figure 3:
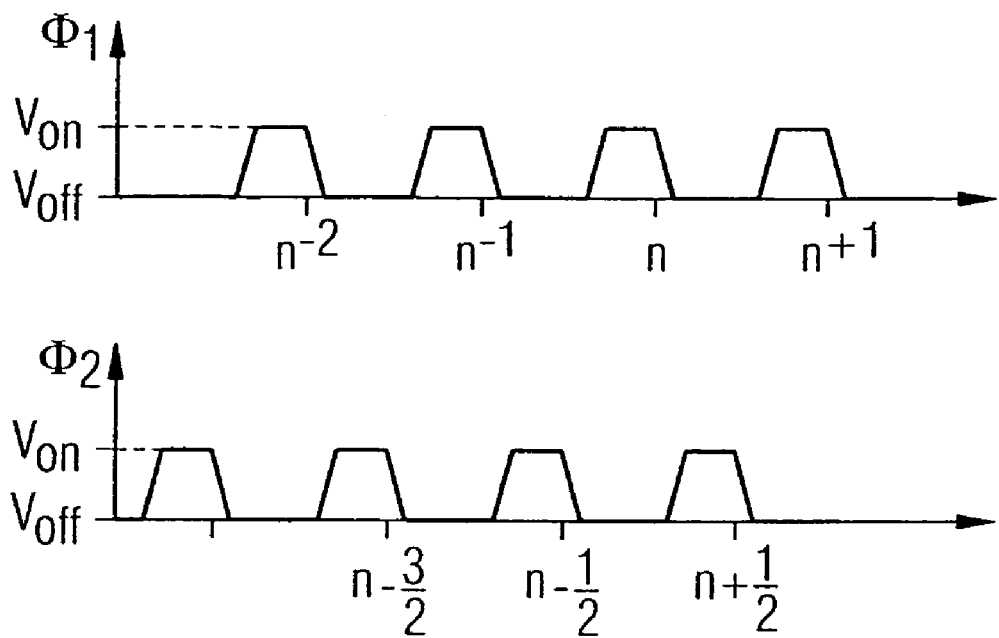
FIG. 3 shows a time characteristic of two clock signals for activating two switches of the apparatus of FIG. 1.

FIG. 1 shows one embodiment of an apparatus 1 for switching on a voltage supply of a voltage domain 6 of a semiconductor circuit. The voltage domain 6 is connected via a NMOS transistor 2 of the apparatus 1 to $V_{SS}$ of the semiconductor circuit, the source-terminal 21 of the NMOS transistor 2 to $V_{SS}$, the drain terminal 22 of the NMOS transistor 2 to the voltage domain 6 and the control input or gate terminal 23 of the NMOS transistor 2 being activated by control means 15 of the apparatus 1. The control means 15 comprise a first switch 4, a second switch 5 and a pump capacitor or a capacitor 3 which is connected to $V_{SS}$ via a first terminal. The first switch 4 is connected by its first terminal to $V_{DD}$ while its second terminal is connected to a second terminal of the capacitor 3 and a first terminal of the second switch 5. A second terminal of the second switch 5 is connected to the gate terminal 23. While the first switch 4 is clocked at a first clock rate $\phi_1$, the second switch is clocked at a second clock rate $\phi_2$. The characteristic of the first clock rate $\phi_1$ and of the second clock rate $\phi_2$ are shown in FIG. 3. It can be seen that the first clock rate $\phi_1$ and the second clock rate $\phi_2$ do not overlap one another. When the first switch 4 is closed by the first clock rate $\phi_1$, the capacitor 3 is charged with $V_{DD}$ as the second switch 5 is opened at this instant owing to the activation by the second clock rate $\phi_2$. When the first switch 4 is opened by the first clock rate $\phi_1$, the second switch 5 is closed by the second clock rate $\phi_2$ almost at the same time, so that a portion of the charge of the capacitor 3 is transferred to the gate capacitor of the NMOS transistor 2 and the gate-source voltage of the NMOS transistor 2 is therefore increased. The gate-source voltage of the NMOS transistor 2 is therefore increased stepwise.

A characteristic of the gate-source voltage of the NMOS transistor 2 can be controlled, on the one hand, by the first clock rate $\phi_1$ and the second clock rate $\phi_2$, by a pulse duty factor of the first clock rate $\phi_1$ relative to the second clock rate $\phi_2$, the frequency of a basic clock rate $\phi$, from which $\phi_1$ and $\phi_2$ are derived, further details of which will be given hereinafter with reference to FIG. 4, and, on the other hand, by the capacitance of the capacitor 3. In an embodiment which is not shown, the capacitor 3 has been replaced by capacitor arrangements connected in parallel or a capacitor network, which enables the control means 15 to switch between various capacitance values so that various rates at which the gate-source voltage of the NMOS transistor 2 is built up can be adjusted. For example, the gate-source voltage of the NMOS transistor 2 could be built up very quickly to the threshold voltage of the NMOS-transistor 2 by using a capacitor arrangement with a high capacitance value, whereas, after attainment of the threshold voltage, i.e. within the Miller plateau, the gate-source voltage of the NMOS transistor is increased only slowly in that the control means 15 bring about a switch to a capacitor arrangement having only a comparatively low capacitance value. As a result, the point from which a current flows through the NMOS transistor 2 is advantageously attained very quickly, while a small further rise in the gate-source voltage of the NMOS transistor 2 subsequently prevents the current through the NMOS-transistor 2 from rising too quickly and too high, so that current peaks are avoided.

The capacitor network can consist of a plurality of capacitors which are binary weighted, which means that an $n^{th}$ capacitor of the capacitor network has a capacitance value which is twice as great as a $(n-1^{th})$ capacitor of the capacitor network. Simple adaptation or programming of a switching on rate of the NMOS transistor 2 can thus be achieved by means of the control means 15.

Figure 2:
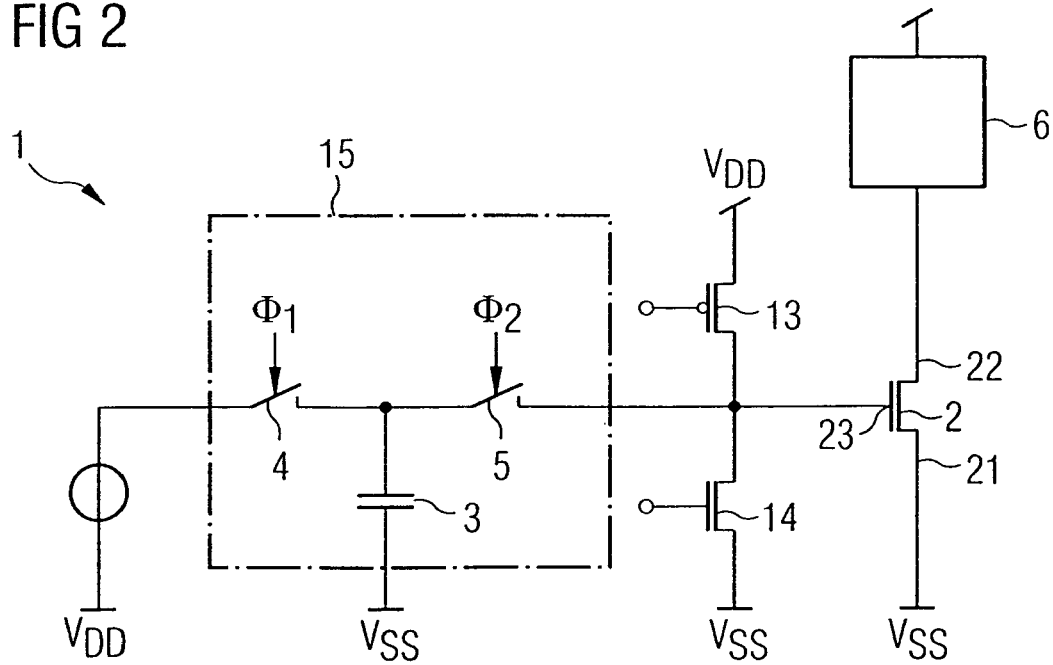
FIG. 2 shows a variation of the apparatus of FIG. 1.

FIG. 2 shows a variation of the apparatus 1 shown in FIG. 1. The apparatus 1 in FIG. 2 additionally comprises a NMOS clamp transistor 14 and a PMOS clamp transistor 13. The source-terminal of the PMOS clamp transistor 13 is connected to $V_{DD}$ and the source terminal of the NMOS clamp transistor 14 to $V_{SS}$, while the drain terminals of both the PMOS clamp transistor 13 and the NMOS clamp transistor 14 are connected to the gate terminal 23 of the NMOS transistor. The two control inputs of the PMOS transistor 13 and the NMOS transistor 14 are activated by the control means 15 in such a way that, when the voltage supply is switched on after passing through the Miller plateau, the PMOS transistor 13 completes the circuit so that the gate terminal 23 of the NMOS transistor 2 is activated in such a way that the NMOS transistor 2 completes the circuit so that the voltage supply is completely switched on.

When the voltage supply of the voltage domain 6 is switched off, the control means 15 activate the gate terminal of the NMOS clamp transistor 14 with $V_{DD}$ so that $V_{SS}$ is connected to the gate terminal 23 of the NMOS transistor 2 via the NMOS clamp transistor 14, so that the NMOS transistor 2 is completely switched off and the voltage supply of the voltage domain 6 is also completely switched off.

Figure 4:
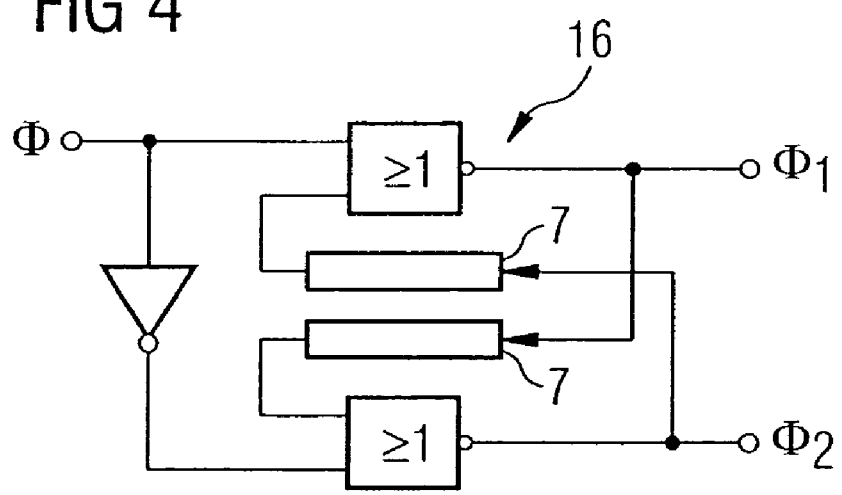
FIG. 4 shows one embodiment of clock generators for the derivation of the clock signals illustrated in FIG. 3 on the basis of a predetermined system clock rate.

FIG. 4 shows a clock generator 16 of the control means 15 with which the first clock rate $\phi_1$ and the second clock rate $\phi_2$ are generated on the basis of a system clock rate $\phi$ of the semiconductor circuit. In this embodiment, an input of the clock generator 16 which is loaded with the system clock rate $\phi$ is connected to a first input of a first NOR gate and the input of an inverter. The output of the inverter is connected to the first input of a second NOR gate. The output of the first NOR gate is connected to a first output of the clock generator 16 and the input of a first delay element 7, it being possible to pick off the first clock rate $\phi_1$ at the first output of the clock generator 16. The output of the second NOR gate is connected to a second output of the clock generator 16 and the input of a second delay element 7, it being possible to pick off the second clock rate $\phi_2$ at the second output of the clock generator 16. Finally, an output of the first delay element 7 is connected to a second input of the second NOR gate and the output of the second delay element 7 to a second input of the first NOR gate.

Figure 5:
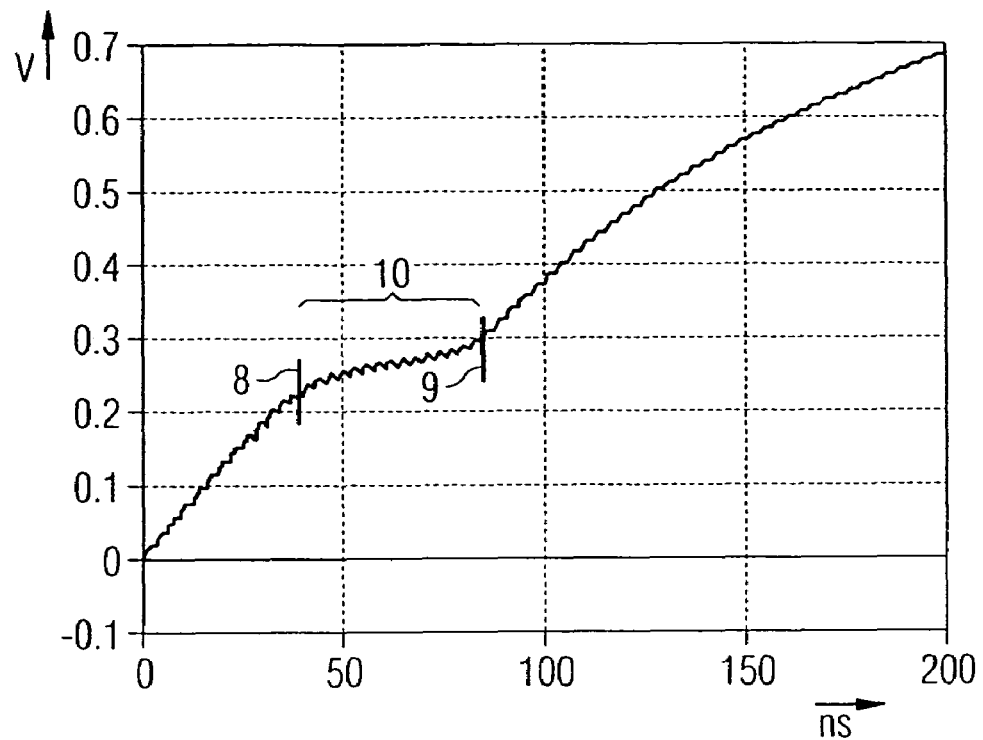
FIG. 5 shows a time characteristic of a voltage between a control input and a first terminal of a transistor of the apparatus of FIG. 1 during stepwise activation.

FIG. 5 shows a time characteristic of the gate-source voltage of the NMOS transistor 2 when using the apparatus shown in FIG. 1 for switching on the voltage supply of the voltage domain 6. While time in nanoseconds is plotted on the X axis, the gate-source voltage of the NMOS transistor 2 is plotted in volts on the y axis. The Miller plateau, which is represented by a flatter portion of the characteristic of the gate-source voltage, can be seen, a beginning of the Miller plateau 10 being identified by a reference 8 and an end of the Miller plateau 10 by a reference 9. It can also be seen that the stages with which the gate-source voltage of the NMOS transistor 2 rise have a very low height so the characteristic is almost continuous.

Figure 6:
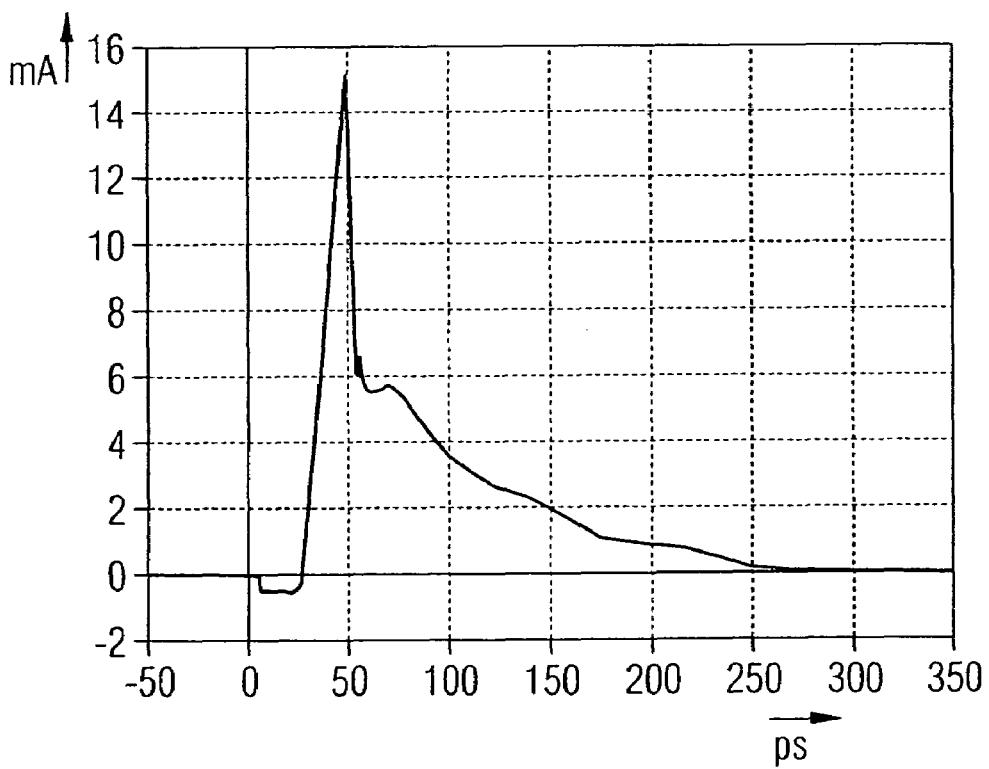
FIG. 6 shows a time characteristic of a current through a switchable element for switching on a voltage supply of a conventional 16-bit Han Carlson adder, when the voltage supply is switched on in one step.
Figure 7:
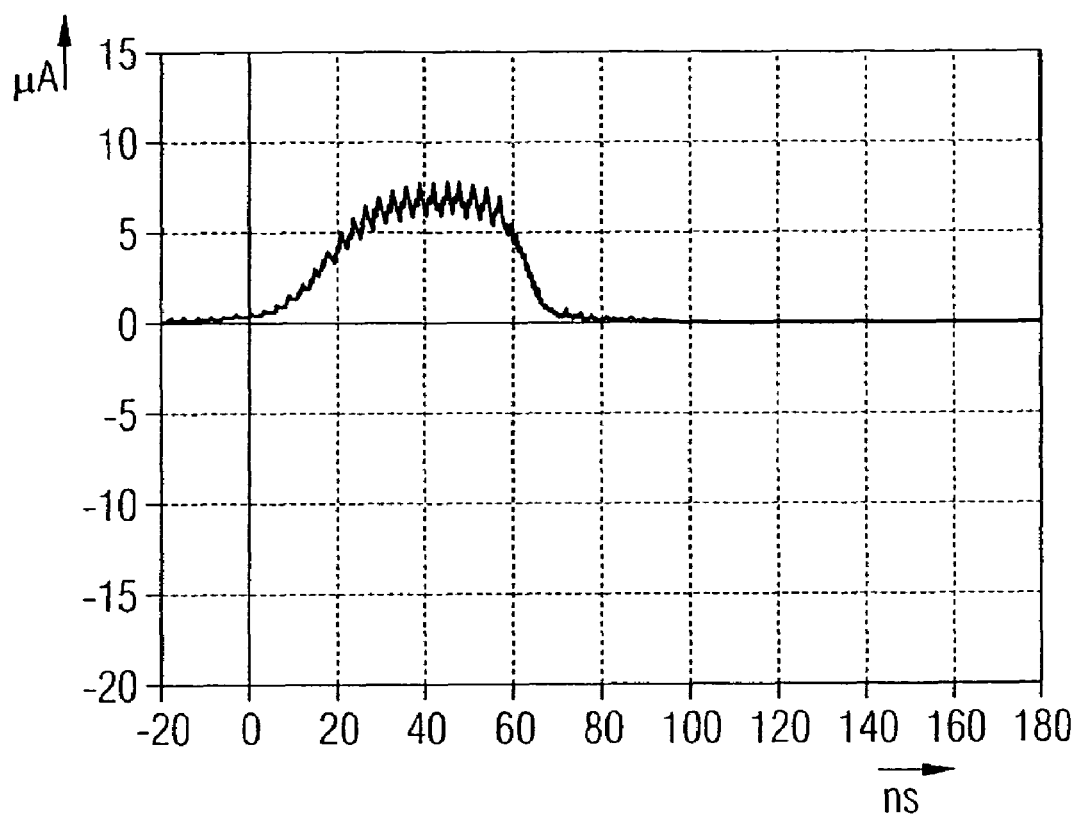
FIG. 7 shows a time characteristic of a current through a transistor for switching on a 16-bit Han Carlson adder when a transistor is activated.

While FIG. 6 shows a time characteristic of the current when switching on a 16-bit Han Carlson adder (not shown) in a conventional manner, FIG. 7 shows the time characteristic of the current when switching on the 16-bit Han Carlson adder attained by the method according to the disclosure. For correct evaluation of the difference between the two current forward travels shown in FIG. 6 and FIG. 7, it is pointed out that picoseconds are plotted on the x axis and milliamperes on the y axis in FIG. 6 whereas the graph shown in FIG. 7 has nanoseconds on the x axis and microamperes on the y axis.

It can be seen that the conventional current characteristic, shown in FIG. 6, has a prominent current peak approximately 50 ps after it has been switched on, whereas the current characteristic shown in FIG. 7 has no current peaks but merely a rounded characteristic when switched on. In other words, when switching on in the manner known from the art, a very great amount of current is drawn in a short time (the peak value is approximately 15 mA), whereas a substantially lower current (the peak value is at approximately 6 uA) flows for a longer period of time with a characteristic according to the disclosure. The method according to the disclosure for switching on the voltage supply therefore reduces the peak value of the current flowing when it is switched on by approximately 2,500 times, so that the drawbacks associated with a high current peak, such as IR drop, dI/dt drop, timing violations and disturbances in operation are drastically reduced.

Figure 8:
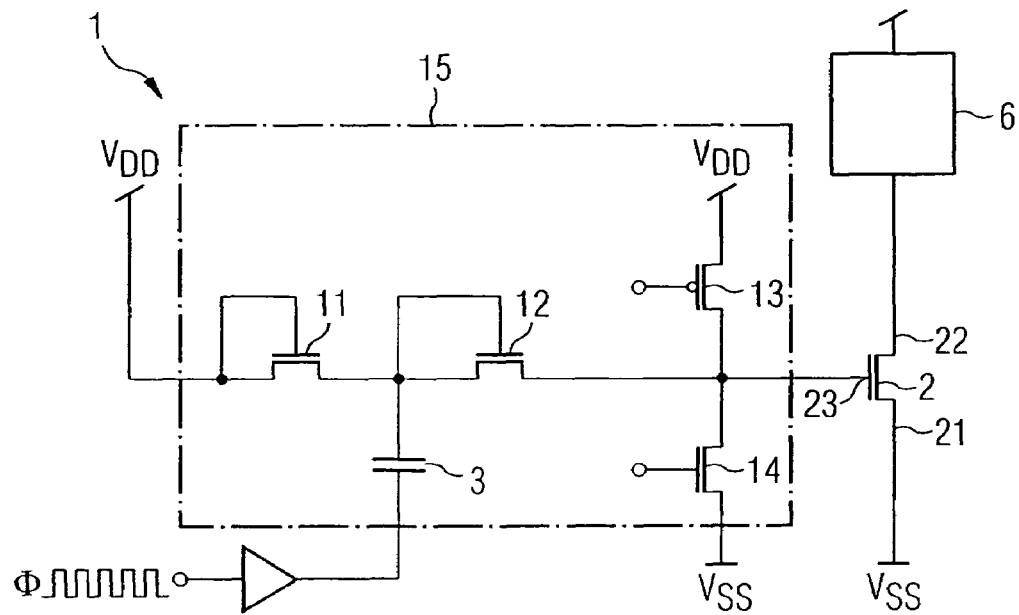
FIG. 8 shows another embodiment of an apparatus for switching on a voltage supply of a voltage domain.

FIG. 8 shows another embodiment of an apparatus 1 for switching on the voltage supply of the voltage domain 6. The embodiment of FIG. 8 differs from the embodiment of FIG. 1 only by the control means 15, so only the control means 15 will be described in detail hereinafter. The control means 15 comprise a first NMOS transistor 11, a second NMOS transistor 12, a PMOS clamp transistor 13 and an NMOS clamp transistor 14 as well as a capacitor 3. A first terminal of the capacitor 3 is connected to a system clock. Both the drain terminal and the gate terminal of the first NMOS transistor 11 are connected to $V_{DD}$ so that the first NMOS transistor operates as a diode. The source terminal of the first NMOS transistor 11 is connected to a second terminal of the capacitor 3, the drain terminal and the gate terminal of the second NMOS transistor 12, so that the second NMOS transistor also operates as a diode. The source terminal of the PMOS clamp transistor 13 is connected to $V_{DD}$ and the source terminal of the NMOS clamp transistor 14 to $V_{SS}$. The source terminal of the second NMOS transistor 12, the drain terminal of the PMOS clamp transistor 13 and the drain terminal of the NMOS clamp transistor 14 are connected to the gate terminal 23 of the NMOS transistor 2.

The embodiment of FIG. 8 of the apparatus 1 according to the disclosure operates as follows: when the system clock rate $\phi$ has the value 0 or $V_{SS}$, the first terminal of the capacitor 3 is at $V_{SS}$ whereas the second terminal of the capacitor 3 is loaded via the first NMOS transistor 11 to a difference from $V_{DD}$ and the threshold voltage. When the system clock rate $\phi$ subsequently has the value 1 or $V_{DD}$, the first terminal of the capacitor 3 is raised to $V_{DD}$ so that the potential of the second terminal of the capacitor 3 is raised beyond $V_{DD}$. The first NMOS transistor 11 therefore blocks and the second NMOS transistor 12 completes the circuit so that charge flows from the capacitor 3 to the gate terminal 23 of the NMOS transistor 2 where it charges the gate capacitor. When the system clock drops to the value 0 again, the potential of the second terminal of the capacitor 3 also drops well below $V_{DD}$ so that the second NMOS transistor 12 is switched off and the first NMOS transistor 11 completes the circuit again and charging of the second terminal of the capacitor 3 begins again. The gate-source voltage of the NMOS transistor 2 is therefore increased stepwise. When the gate-source voltage of the NMOS transistor 2 has been increased to the end 9 of the Miller plateau 10 (see FIG. 4) by the stepwise increase, the control means 15 activate the gate terminal of the PMOS clamp transistor 13 with $V_{SS}$, so that $V_{DD}$ is connected via the PMOS clamp transistor 13 to the gate terminal 23 of the NMOS transistor 2 so that the NMOS transistor 2 completes the circuit.

When the voltage supply of the voltage domain 6 is switched off, the control means 15 activate the gate terminal of the NMOS clamp transistor 14 with $V_{DD}$, so that $V_{SS}$ is connected via the NMOS clamp transistor 14 to the gate terminal 23 of the NMOS transistor 2, so that the NMOS transistor 2 is completely switched so as to be non-integrated or switched off.

Figure 9:
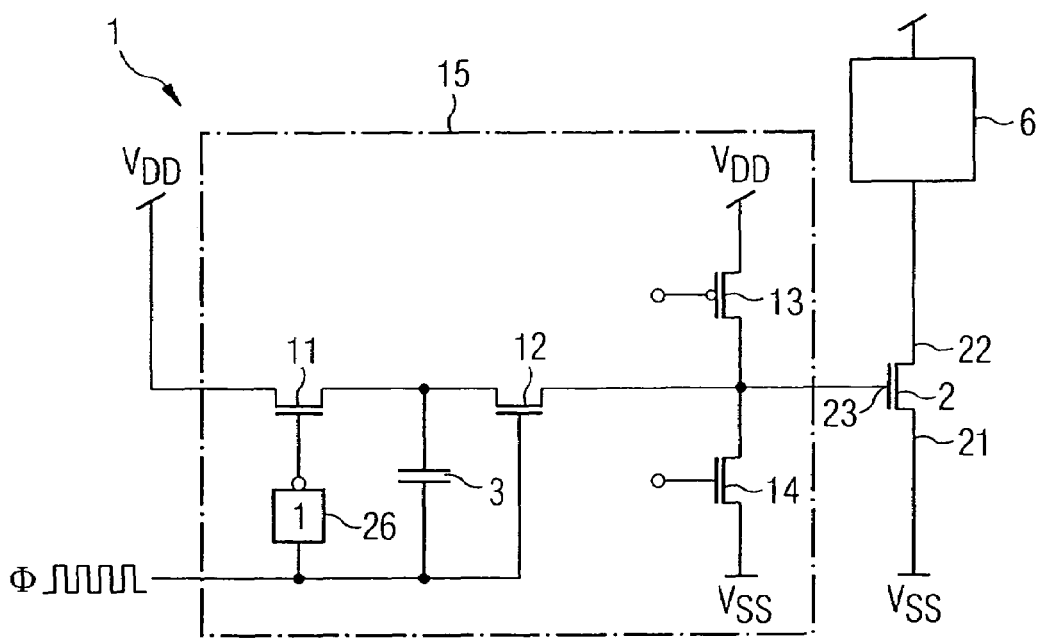
FIG. 9 shows a variation of the apparatus of FIG. 8.

FIG. 9 shows a variation of the apparatus shown in FIG. 8. The apparatuses 1 in FIG. 8 and FIG. 9 differ only with respect to the control means 15, so only this difference will be dealt with hereinafter. The control means 15 in FIG. 9 comprise an inverter 26 in addition to the first NMOS transistor 11, the second NMOS transistor 12, the PMOS clamp transistor 13 and the NMOS clamp transistor 14 and the capacitor 3. In this embodiment, the system clock is connected to the input of the inerter 26, the first terminal of the capacitor 3 and the gate terminal of the second NMOS transistor 12.

The supply voltage $V_{DD}$ is connected to the drain terminal of the first NMOS transistor 11. The output of the inverter 26 supplies the gate terminal of the first NMOS transistor 11 while the source terminal, the second terminal of the capacitor 3 and the drain terminal of the second NMOS transistor 12 are interconnected. As with the control means 15 in FIG. 8, the source terminal of the second NMOS transistor 12, the drain terminal of the PMOS clamp transistor 13, the drain terminal of the NMOS clamp transistor 14 and the gate terminal of the NMOS transistor 2 are interconnected.

When the system clock $\phi$ has the value 0 or $V_{SS}$, the first NMOS transistor 11 is switched on by the inverter 26 so charge can flow from $V_{DD}$ to the capacitor 3 while at the same time the second NMOS transistor 12 is switched off. When the system clock $\phi$ subsequently assumes the value 1 or $V_{DD}$, the first NMOS transistor 11 is switched on by the inverter 26 whereas the second NMOS transistor 12 is switched off. The potential of the second terminal of the capacitor 3 is simultaneously raised over $V_{DD}$ and charge flows from the capacitor 3 via the second NMOS transistor 12 to the gate capacitor of the NMOS transistor 2. The gate source voltage of the NMOS transistor 2 is thus increased stepwise.

In contrast to the apparatus in FIG. 8, the system clock $\phi$ in the apparatus 1 in FIG. 9 is also used to switch the first and second NMOS transistor 11, 12 in a controlled manner so that one of the two is invariably blocked. This ensures that, for example, no charge flows directly from $V_{DD}$ via the two NMOS transistors, 11, 12 to the gate terminal 23 of the NMOS transistor 2 and thus charges the gate capacitor of the NMOS transistor 2 in an uncontrolled manner.

Figure 10:
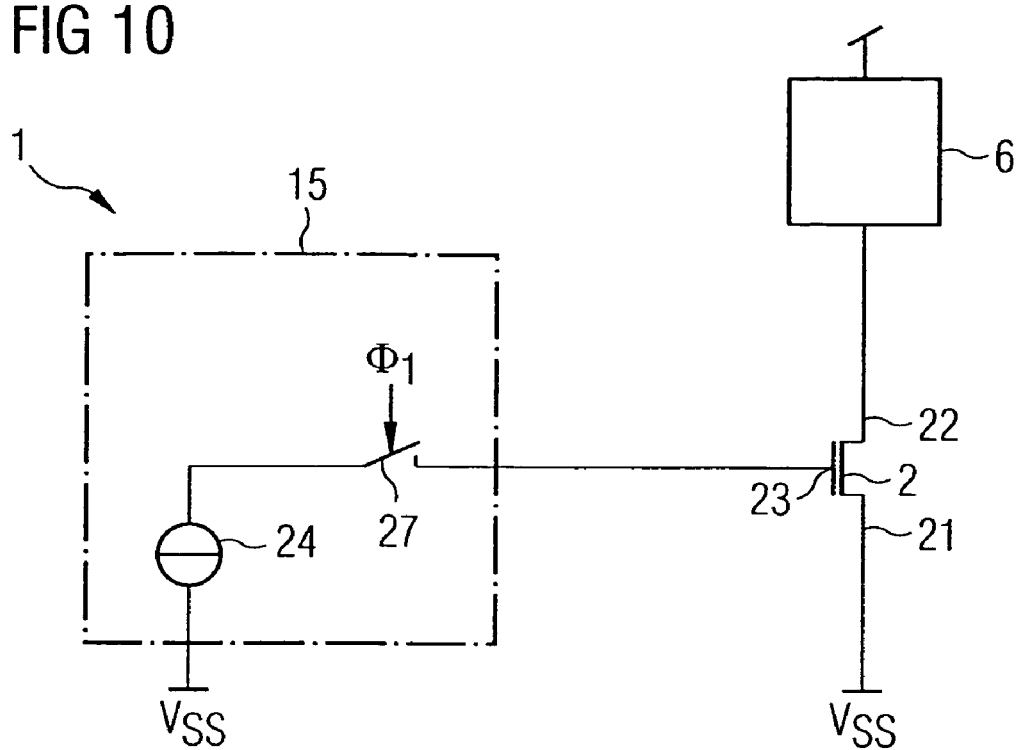
FIGS. 10 and 11 each show further embodiments of apparatuses for switching on a voltage supply of a voltage domain.

FIG. 10 shows a further embodiment of an apparatus for switching on a voltage supply of a voltage domain wherein the control means 15 comprising a current source 24 and a switch 27 which is closed as a function of a clock rate $\phi_1$. When the switch 27 is closed in this embodiment, current flows via the switch 27 to the gate terminal 23 of the NMOS transistor 2, so that the gate capacitor of the NMOS transistor 2 is charged stepwise.

Figure 11:
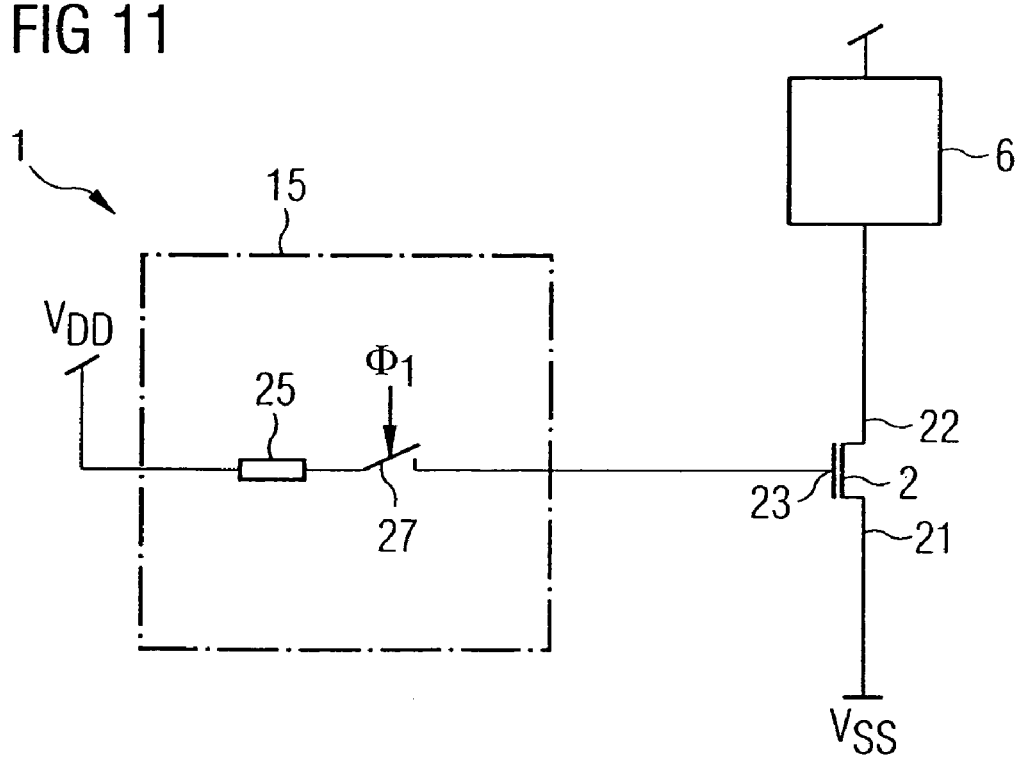

FIG. 11 shows a further embodiment of an apparatus for switching on a voltage supply of a voltage domain wherein the control means 15 comprise a resistor 25 and a switch 27.

A terminal of the resistor 25 is connected to $V_{DD}$ and a second terminal of the resistor 25 to a first terminal of the switch 27 which is closed as a function of the clock rate $\phi_1$, while a second terminal of the switch 27 is connected to the gate terminal 23 of the NMOS transistor 2. When the switch 27 is closed as a function of the clock rate $\phi_1$, current flows via the resistor 25 and the switch 27 to the gate terminal 23 of the NMOS transistor 2, so that the gate capacitor of the NMOS transistor 2 is charged stepwise.

To sum up, it is noted that the method according to the disclosure can be used in any concepts known from the art for switching off a voltage supply of a semiconductor circuit. The method according to the disclosure can also be used, for example, in any variations known from the art, of so-called sleep transistors, which are also known as microswitches. In addition, the method according to the disclosure can also be used only for some of the switchable elements required conventionally, as a switching on rate is already artificially decelerated. The term "switching-on rate" refers to a rise in the current through the switchable element or the transistor 2 for switching on the voltage supply per unit time. In the same way, the method according to the disclosure can similarly be used for a concentrated or large switch. The method according to the disclosure can therefore be integrated easily into conventional concepts.

When using the apparatus according to the disclosure for switching on the voltage supply, moreover, the consumption per unit area is less than with conventional apparatuses as it is conventional in practice to arrange one delay element for each microswitch so that the microswitches switch at different times. When using the apparatus according to the disclosure, at least some of these delay elements are not required, so a corresponding area, less the area required for the apparatus according to the disclosure, is saved.

In addition, the method according to the disclosure is more robust than conventional methods against process variations in the production of a semiconductor circuit, in which the method according to the disclosure or the apparatus according to the disclosure are employed, as, with the method according to the disclosure, the switching-on rate can be adapted to the characteristics of the semiconductor circuit, for example, by setting the capacitance value of the capacitor network accordingly.

It is therefore intended that the foregoing detailed description be regarded as illustrative rather than limiting, and that it be understood that it is the following claims, including all equivalents, that are intended to define the spirit and scope of this disclosure.

The invention claimed is:

1. A method of switching on a voltage supply of a semiconductor circuit, the method comprising:
   activating a transistor connecting the voltage supply and a supply voltage of the semiconductor circuit to increase a voltage between a control input of the transistor and a first terminal of the transistor in a stepwise manner;
   wherein a step height, with which the voltage between the control input of the transistor and the first terminal of the transistor is increased stepwise, is greater up to attainment of a Miller plateau than after attainment of the Miller plateau.

2. The method of claim 1, wherein a number of steps in the stepwise increase of the voltage between the control input of the transistor and the first terminal of the transistor is greater than 2.

3. The method of claim 1, wherein a step height of each stepwise increase of the voltage between the control input of the transistor and the first terminal of the transistor is equal.

4. The method of claim 1, wherein a time interval which elapses until a step height, with which the voltage between the control input of the transistor and the first terminal of the transistor is increased stepwise, is increased, is shorter up to attainment of a Miller plateau than after attainment of the Miller plateau.

5. The method of claim 1, further comprising:
detecting a threshold voltage between the control input of the transistor and the first terminal of the transistor, wherein the threshold voltage is the voltage at which the Miller plateau begins;
wherein increasing the voltage between a control input of the transistor and a first terminal of the transistor in a stepwise manner comprises first increasing the voltage by the threshold voltage.

6. The method of claim 1, wherein the voltage between the control input of the transistor and the first terminal of the transistor is increased by using a capacitor network of adjustable capacitance.

7. The method of claim 1, wherein a time characteristic, with which the voltage between the control input of the transistor and the first terminal of the transistor is increased is adapted in such a way that a minimum time interval elapses until the voltage supply with which a voltage domain of the semiconductor circuit is supplied is switched on in such a way, at a predetermined maximum current through the transistor, that all elements arranged inside the voltage domain operate correctly.

8. The method of claim 1, wherein the control input of the transistor is activated on attainment of the end of the Miller plateau in such a way that the voltage supply is completely switched on.

9. A method of switching on a voltage supply of a semiconductor circuit, the method comprising:
activating a transistor connecting the voltage supply and a supply voltage of the semiconductor circuit to increase the voltage between a control point of the transistor and a first terminal of the transistor in a stepwise manner;
wherein the voltage between the control point of the transistor and the first terminal of the transistor is first increased with a first voltage up to attainment of a Miller plateau and the voltage between the control point of the transistor and the first terminal of the transistor is then increased with a voltage less than the first voltage.

10. An apparatus for switching on a voltage supply of a semiconductor circuit, the apparatus comprising:
a first transistor connecting the voltage supply to a supply voltage of the semiconductor circuit; and
control means operative to activate the first transistor in such a way that a voltage between a control input of the transistor and a first terminal of the first transistor is increased stepwise;
wherein the control means is configured in such a way that a step height, with which the voltage between the control input of the transistor and the first terminal of the transistor is increased stepwise, is greater up to attainment of a Miller plateau than after attainment of the Miller plateau.

11. The apparatus of claim 10, wherein the control means is configured in such a way that a number of steps in the stepwise increase of the voltage between the control input of the transistor and the first terminal of the transistor is greater than 2.

12. The apparatus of claim 10, wherein the control means comprise a capacitor for switching on the voltage supply.

13. The apparatus of claim 12, wherein the control means comprise a first switch and a second switch, wherein a first terminal of the capacitor is connected to the supply voltage of the semiconductor circuit, wherein a connection between a second supply voltage of the semiconductor circuit and a second terminal of the capacitor can be switched by the first switch, and wherein a connection between the second terminal of the capacitor and the control input of the transistor can be switched by the second switch.

14. The apparatus of claim 13, wherein the apparatus comprises clock generators, wherein the clock generators are configured in such a way that they generate a first clock rate and a second clock rate, wherein the apparatus is configured in such a way that the first switch is switched with the first clock rate and the second switch with the second clock rate, and wherein the first clock rate and the second clock rate do not overlap one another and have the same frequency.

15. The apparatus of claim 12, wherein the control means comprise a diode and a second transistor, wherein the first terminal of the capacitor is connected to a clock signal, wherein a second terminal of the capacitor is connected via the diode in the blocking direction to a second supply voltage of the semiconductor circuit, to the control input of the first transistor and to a first terminal of the first transistor, and wherein a second terminal of the first transistor is connected to the control input of the second transistor.

16. The apparatus of claim 12, wherein the control means comprise a second transistor, a third transistor and an inverter in that a first terminal of the second transistor is connected to a second supply voltage, wherein a first terminal of the capacitor, the input of the inverter and the control input of the third transistor are connected to a clock signal, wherein the output of the inverter is connected to the control input of the second transistor, wherein a second terminal of the capacitor is connected to a second terminal of the second transistor and a first terminal of the third transistor, and wherein a second terminal of the third transistor is connected to the control input of the transistor.

17. The apparatus of claim 13, wherein the control means comprise a second transistor and a third transistor, wherein the apparatus is configured in such a way that the control input of the first transistor can be activated via the second transistor in such a way that the first transistor completes the circuit and wherein the control input of the first transistor can be activated via the third transistor in such a way that the first transistor is completely switched off.

18. An apparatus for switching on a voltage supply of a semiconductor circuit, the apparatus comprising:
a transistor connecting the voltage supply to a supply voltage of the semiconductor circuit; and
control means operative to activate the transistor in such a way that a voltage between a control input of the transistor and a first terminal of the transistor is increased stepwise;
wherein the control means is configured such that a time interval which elapses until a step height, with which the voltage between the control input of the transistor and the first terminal of the transistor is increased stepwise, is increased, is shorter up to attainment of a Miller plateau than after attainment of the Miller plateau.

19. An apparatus for switching on a voltage supply of a semiconductor circuit, the apparatus comprising:
a transistor connecting the voltage supply to a supply voltage of the semiconductor circuit; and
control means operative to activate the transistor in such a way that a voltage between a control input of the transistor and a first terminal of the transistor is increased stepwise;

wherein the control means is further operative to detect a threshold voltage between the control input of the transistor and the first terminal of the transistor, wherein the threshold voltage is the voltage at which a Miller plateau begins; and wherein increasing the voltage between a control input of the transistor and a first terminal of the transistor in a stepwise manner comprises first increasing the voltage by the threshold voltage.

20. An apparatus for switching on a voltage supply of a semiconductor circuit, the apparatus comprising:
   a transistor connecting the voltage supply to a supply voltage of the semiconductor circuit; and
   control means operative to activate the transistor in such a way that a voltage between a control point of the transistor and a first terminal of the transistor is increased stepwise;
   wherein the control means is configured such that the voltage between the control point of the transistor and the first terminal of the transistor is first increased with a first voltage up to attainment of a Miller plateau and the voltage between the control point of the transistor and the first terminal of the transistor is then increased with a voltage less than the first voltage.

21. A method of switching on a voltage supply of a semiconductor circuit, the method comprising:
   activating a transistor connecting the voltage supply and a supply voltage of the semiconductor circuit to increase a voltage between a control input of the transistor and a first terminal of the transistor in a stepwise manner;
   wherein a time interval which elapses until a step height, with which the voltage between the control input of the transistor and the first terminal of the transistor is increased stepwise, is increased, is shorter up to attainment of a Miller plateau than after attainment of the Miller plateau.

22. A method of switching on a voltage supply of a semiconductor circuit, the method comprising:
   activating a transistor connecting the voltage supply and a supply voltage of the semiconductor circuit to increase a voltage between a control input of the transistor and a first terminal of the transistor in a stepwise manner; and
   detecting a threshold voltage between the control input of the transistor and the first terminal of the transistor, wherein the threshold voltage is the voltage at which a Miller plateau begins;
   wherein increasing the voltage between a control input of the transistor and a first terminal of the transistor in a stepwise manner comprises first increasing the voltage by the threshold voltage.

* * * * *

UNITED STATES PATENT AND TRADEMARK OFFICE
CERTIFICATE OF CORRECTION

PATENT NO.        : 7,427,882 B2
APPLICATION NO.   : 11/498505
DATED             : September 23, 2008
INVENTOR(S)       : Stephan Henzler et al.

It is certified that error appears in the above-identified patent and that said Letters Patent is hereby corrected as shown below:

On the Title Page

Item (30), line 1, under "Foreign Application Priority Data", delete "10 2005 038 231" and substitute --10 2005 038 231.2-- in its place.

Signed and Sealed this

Second Day of June, 2009

JOHN DOLL
*Acting Director of the United States Patent and Trademark Office*